United States Patent
Clabes et al.

(10) Patent No.: US 6,728,944 B2
(45) Date of Patent: Apr. 27, 2004

(54) METHOD, SYSTEM, AND COMPUTER PROGRAM PRODUCT FOR IMPROVING WIREABILITY NEAR DENSE CLOCK NETS

(75) Inventors: Joachim Gerhard Clabes, Austin, TX (US); Thomas Edward Rosser, Austin, TX (US)

(73) Assignee: Intenational Business Machines Corporation, Armonk, NY (US)

( * ) Notice: Subject to any disclaimer, the term of this patent is extended or adjusted under 35 U.S.C. 154(b) by 183 days.

(21) Appl. No.: 09/998,049

(22) Filed: Nov. 29, 2001

(65) Prior Publication Data

US 2003/0101427 A1 May 29, 2003

(51) Int. Cl.$^7$ .............................................. G06F 17/50
(52) U.S. Cl. ................................ 716/13; 716/2; 716/12
(58) Field of Search ................................ 716/13, 2, 12

(56) References Cited

U.S. PATENT DOCUMENTS

| | | | | |
|---|---|---|---|---|
| 5,564,022 A | * | 10/1996 | Debnath et al. | 713/503 |
| 5,790,841 A | * | 8/1998 | Scherer et al. | 713/503 |
| 5,917,729 A | * | 6/1999 | Naganuma et al. | 716/10 |
| 6,513,149 B1 | * | 1/2003 | Donato | 716/12 |
| 6,519,749 B1 | * | 2/2003 | Chao et al. | 716/9 |
| 6,539,528 B2 | * | 3/2003 | Hwang et al. | 716/10 |

* cited by examiner

Primary Examiner—A. M. Thompson

(74) Attorney, Agent, or Firm—Duke W. Yee; Mark E. McBurney; Lisa L. B. Yociss

(57) ABSTRACT

A method, system, and computer product are disclosed for improving wireability near clock nets in a logic design that includes multiple logic blocks. Each of the logic blocks has an actual physical size. Logic blocks that are a particular type are identified. During placement of the logic blocks, an apparent physical size of each of the identified logic blocks is utilized as a physical size for the identified logic block. The apparent physical size is larger than the actual physical size. During routing, the actual physical size of each of the identified logic blocks is utilized.

24 Claims, 2 Drawing Sheets

METHOD, SYSTEM, AND COMPUTER PROGRAM PRODUCT FOR IMPROVING WIREABILITY NEAR DENSE CLOCK NETS

1. Technical Field

The present invention relates generally to the field of integrated circuit design, and, more specifically, to the field of logic synthesis of electronic circuit designs. Yet more specifically, the present invention relates to a method, system, and computer program product for improving wireability near dense clock nets.

2. Description of Related Art

Microelectronic integrated circuits consist of a large number of electronic components that are fabricated by layering several different materials on a silicon base or wafer. The design of an integrated circuit transforms a circuit description into a geometric description which is known as a layout. The process of converting the functional specifications of an electronic circuit into a layout is called the physical design.

The objective of physical design is to determine an optimal arrangement of devices in a plane or in a three dimensional space, and an efficient interconnection or routing scheme between the devices to obtain the desired functionality.

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins.

The input to the physical design problem is a circuit diagram, and the output is the layout of the circuit. This is accomplished in several stages including partitioning, floor planning, placement, routing and compaction.

Placement of logic blocks involves first obtaining information defining a logic block. The information includes the actual physical dimensions of the logic block. An appropriate amount of physical space is then allocated within which to place the logic block.

Due to the large number of components and the exacting details required by the fabrication process, physical design is not practical without the aid of computers. As a result, most phases of physical design extensively use Computer Aided Design (CAD) tools.

When a placement tool is used, a physical size of each logic block is determined. The logic block is placed in an area which is large enough for the particular logic block. Routing is then completed. Modern synthesis tools interact with the placement of the logic as they make optimization choices in the logic, including how the clocks are distributed to the latches in the logic.

Routing near dense clock distribution blocks, such as local clock buffers (LCB), can be difficult. These dense clock nets occur when many latches are located near the LCBs. The problem is compounded for particular types of LCBs which use three clocks, a master, slave, and scan clock. In addition, the latches tend to use a lot of low level metal in their internal wiring, adding even more to the congestion and making their logic pins hard to access on that low level of metal.

Therefore, a need exists for a method, system, and product for improving wireability near dense clock nets.

SUMMARY OF THE INVENTION

A method, system, and computer product are disclosed for improving wireability near clock nets in a logic design that includes multiple logic blocks. Each of the logic blocks has an actual physical size. Logic blocks that are a particular type are identified Dining placement of the logic blocks, an apparent physical size of each of the identified logic blocks is utilized as a physical size for the identified logic block. The apparent physical size is larger than the actual physical size. During routing, the actual physical size of each of the identified logic blocks is utilized The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
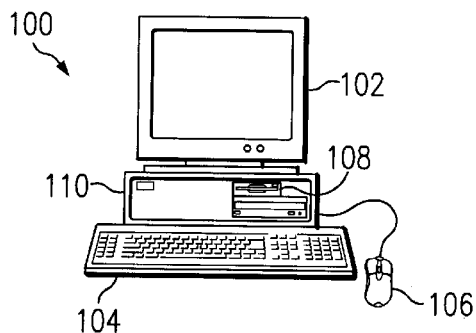
FIG. 1 is a pictorial representation which depicts a data processing system in which the present invention may be implemented in accordance with a preferred embodiment of the present invention.

A preferred embodiment of the present invention and its advantages are better understood by referring to the figures, like numerals being used for like and corresponding parts of the accompanying figures.

The present invention is a method, system, and computer product for improving wireability near clock nets in a logic design that includes multiple logic blocks. During the placement of particular types of devices, an apparent physical size is used as the size of the device to be placed instead of the actual size. The apparent physical size is larger than the actual physical size. Later, during routing, the actual size is used for each device. In this manner, for these particular types of devices a buffer of unused space is created around each of these particular types of devices which thus makes routing around these devices easier.

The particular types of devices include clock buffers and latches. An apparent physical size of each of the clock buffers and latches is used during the placement of these devices. During routing, the actual physical size is used.

The apparent physical size of a particular device is determined by first setting the apparent physical size equal to the maximum physical size for this type of particular device. The apparent physical size is then increased by a defined perimeter buffer.

A "book", or "logic block", refers herein to an identifiable primitive function (i.e., "cell"). This includes a pre-designed circuit for performing a certain Boolean function, together with certain information about the circuit. The invention relates to a design automation system which has libraries of these books for use in building circuits. The library includes different sizes and different strengths for a particular type of book or logic block. The library could include several different physical sizes for a particular type of local clock buffer as well as several different physical sizes for a particular type of latch. For example, the synthesis tool could have three different physical sizes of a particular type of local clock buffer from which to select when this type of local clock buffer is specified by the logic design. For example, the three different physical sizes could be 30 wire channels by 16 wire channels, 35 wire channels by 16 wire channels, and 40 wire channels by 16 wire channels. By making the apparent size of the block be larger than the largest physical size, the synthesis tool will be unconstrained in its choice of physical size without requiring re-placement of the books to make room for a larger physical block.

In addition to using an apparent physical size for each LCB and latch during placement instead of the actual physical size, wireability near dense clock nets can also be improved by centering each LCB within a rectangle that is defined by the latches to which the LCB is connected. This causes the router to branch close to the LCB, thus preventing a daisy chain route.

Further, wireability can be improved by exchanging fanout latches of a first LCB with the fanout latches of a second LCB when a majority of the fanout latches of the first LCB are physically closer to the second LCB. This prevents crossed wires that lead to congestion.

Yet another method for improving wireability is to use a high net weight for each LCB. This will keep the latches reasonably close to the LCB.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 102, a video display terminal 104, a keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
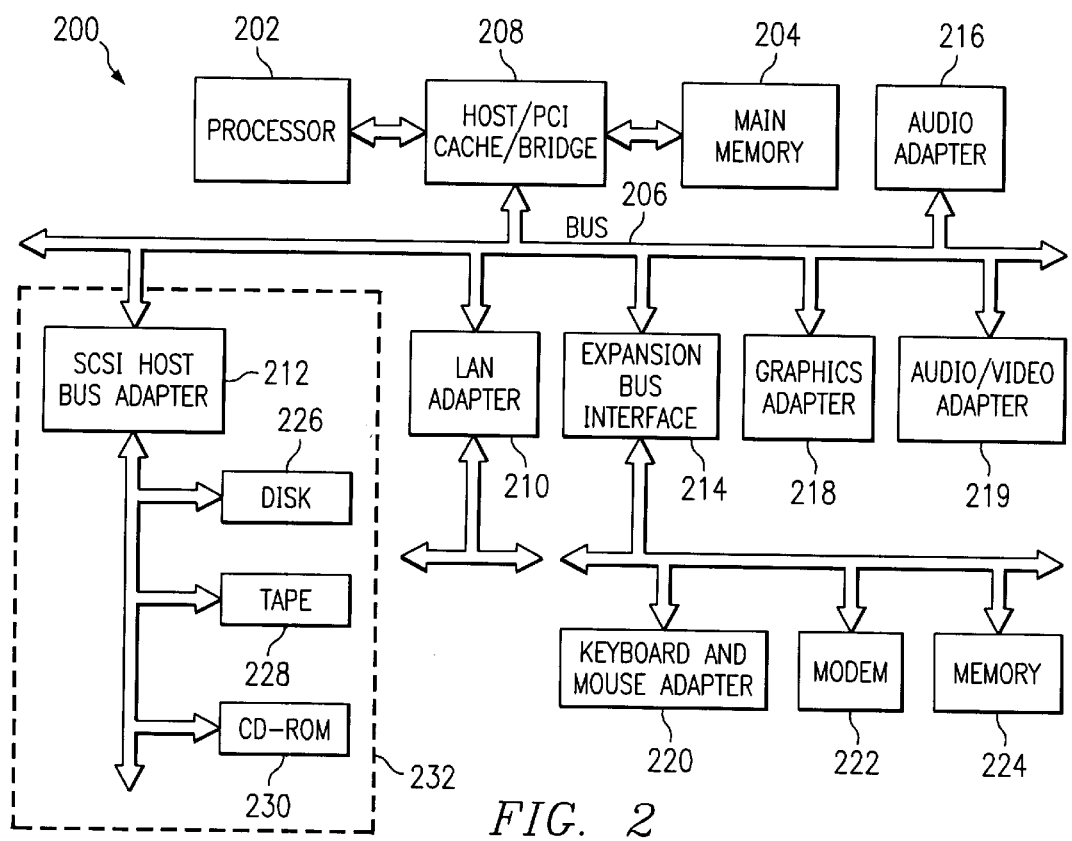
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
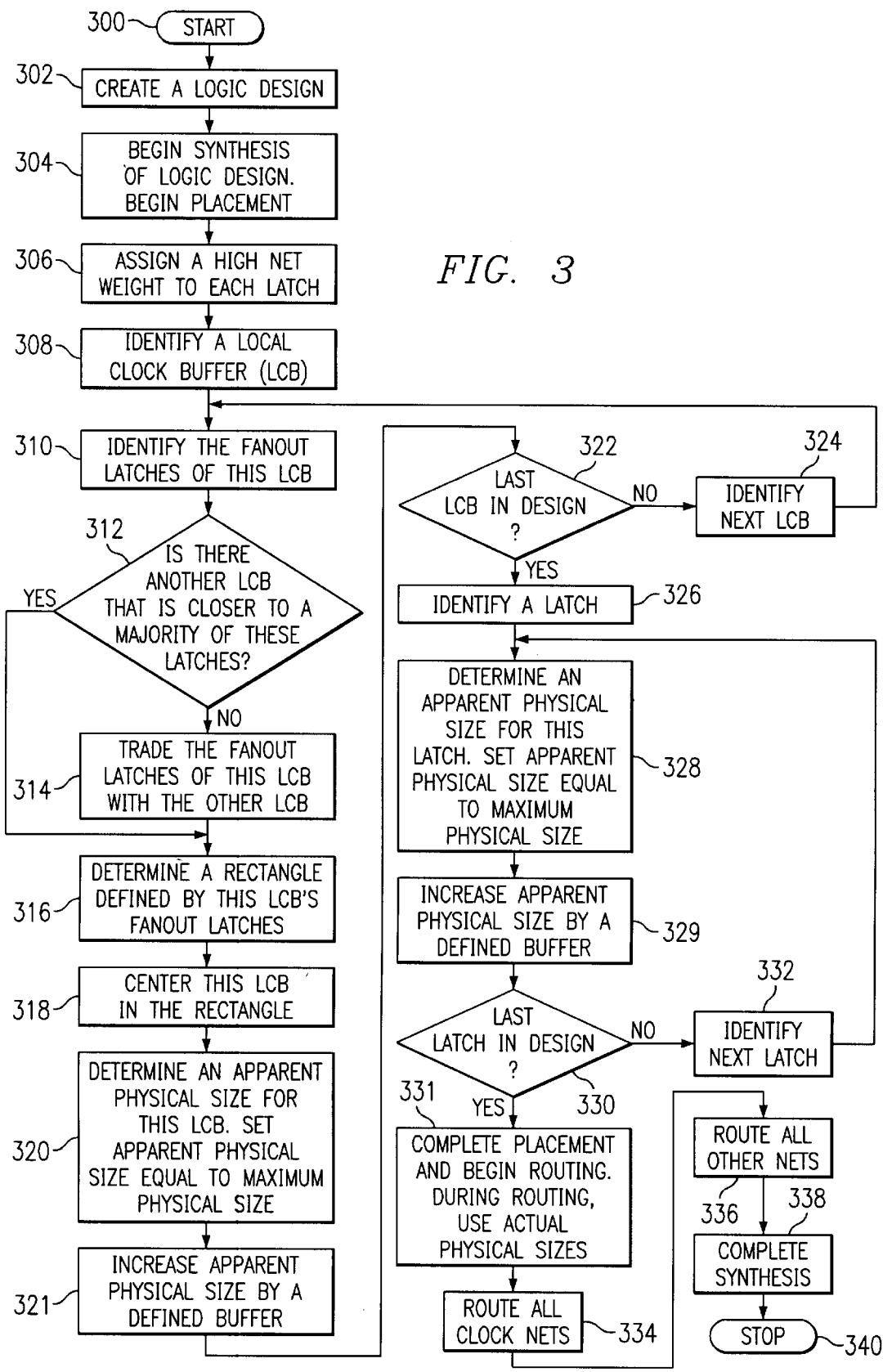
FIG. 3 is a high level flow chart which depicts improving wireability near dense clock nets in accordance with the present invention.

FIG. 3 is a high level flow chart which depicts improving wireability near dense clock nets in a logic design in accordance with the present invention. The process starts as depicted by block 300 and thereafter passes to block 302 which illustrates creating a logic design which includes a plurality of logic blocks, such as local clock buffers and latches. Each logic block has an actual physical size. Next, block 304 depicts beginning a synthesis of the logic design. Placement of logic blocks is begun. The process then passes to block 306 which illustrates assigning a high net weight to each latch in the logic design. Thereafter, block 308 depicts identifying a local clock buffer (LCB) in the design.

Next, block 310 depicts identifying the latches which are the devices that are fed by this LCB. These devices are referred to herein as the "fanout latches". Block 312, then, illustrates a determination of whether or not there is another LCB that is physically closer to a majority of these fanout latches. If such an LCB exists that is physically closer to a majority of the fanout latches, the process passes to block 314 which depicts trading the fanout latches of this LCB with the fanout latches of the other LCB. The LCBs are not physically moved. They exchange fanout latches. The process then passes to block 316 which illustrates determining a rectangle defined by this LCB's fanout latches. Thereafter, block 318 depicts centering this LCB within the rectangle. Next, block 320 illustrates determining an apparent physical size for this LCB. The apparent physical size is first set equal to the maximum possible LCB size. The process then passes to block 321 which depicts increasing the apparent physical size of this local clock buffer by a defined perimeter buffer. The perimeter buffer is a defined amount by which to increase the apparent physical size. The perimeter buffer may be a uniform amount around each side of the device, or may vary from one side of the device to another. As an example, the perimeter buffer might be defined to be 3 wire channels on each side of a device.

Block 322, then, depicts a determination of whether or not this is the last LCB in the logic design. If a determination is made that this is not the last LCB in the logic design, the process passes to block 324 which illustrates identifying the next LCB in the logic design. The process then passes to block 310.

Referring again to block 322, if a determination is made that this is the last LCB in the logic design, the process passes to block 326 which illustrates identifying a latch in the logic design. Thereafter, block 328 depicts determining an apparent physical size for this latch. The apparent physical size is first set equal to the maximum possible latch size. The process then passes to block 329 which depicts increasing the apparent physical size of this latch by a defined perimeter buffer. Next, block 330 illustrates a determination of whether or not this is the last latch in the logic design. If a determination is made that this is not the last latch in the logic design, the process passes to block 332 which depicts identifying the next latch in the logic design. The process then passes back to block 328.

Referring again to block 330, if a determination is made that this is the last latch in the logic design, the process passes to block 333 which illustrates completing the placement process and starting the routing process. During routing, all actual physical sizes of the logic blocks are used. Block 334 illustrates routing all clock nets first. Thereafter, block 336 depicts routing all other nets in the logic design. Next, block 338 illustrates completing the synthesis of this logic design. The process then terminates as depicted by block 340.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for improving wireability near clock nets in a logic design that includes a plurality of logic blocks, said method comprising the steps of:

identifying ones of said plurality of logic blocks that are a particular type of logic block each one of said plurality of logic blocks having an actual physical size;

during placement of said plurality of logic blocks and synthesis of said logic design, utilizing an apparent physical size for each of said identified ones of said plurality of logic blocks as a physical size for said identified ones, said apparent physical size being larger than said actual physical size identified ones; and during routing, utilizing said actual physical size for each of said identified ones of said plurality of logic blocks as the physical size for said identified ones;

identifying a maximum physical size for each one of said plurality of logic blocks that are a particular type;

specifying a perimeter buffer size: and specifying said apparent physical size to be equal to said maximum physical size plus said perimeter buffer size.

2. The method according to claim 1, further comprising the steps of:

providing a library of said ones of said plurality of logic blocks that are said particular type, said library including said ones of said plurality of logic blocks that have different physical sizes; and increasing an apparent physical size by selecting a first one of ones of said plurality of logic blocks that is said particular type, said first one having a maximum physical size.

3. The method according to claim 1, further comprising the steps of:

identifying ones of said plurality of logic blocks that are clock buffers; and increasing an apparent physical size of each one of said clock buffers.

4. The method according to claim 1, further comprising the steps of:

identifying ones of said plurality of logic blocks that are latches; and increasing an apparent physical size of each one of said latches.

5. The method according to claim 1, further comprising the steps of:

identifying a first one of said plurality of logic blocks, said first one of said plurality of logic blocks being said particular type;

identifying ones of said plurality of logic blocks that are fed by said first one of said plurality of logic blocks;

determining a region defined by a physical location of each one of said identified ones of said plurality of logic blocks that are fed by said first one; and placing said first one of said plurality of logic blocks at a physical location in said logic design that is a center of said region.

6. The method according to claim 5, further comprising the steps of:

determining a rectangle defined by said physical location of each one of said identified ones of said plurality of logic blocks that are fed by said first one of said plurality of logic blocks; and placing said first one of said plurality of logic blocks at a physical location in said logic design that is a center of said rectangle.

7. The method according to claim 1, further comprising the steps of:

identifying ones of said plurality of logic blocks that are latches; and assigning a high net weight to each one of said identified latches.

8. The method according to claim 1, further comprising the steps of:

identifying a first clock buffer;

identifying first ones of said plurality of logic blocks that are fed by said first clock buffer;

identifying a second clock buffer;

identifying second ones of said plurality of logic blocks that are fed by said second clock buffer;

determining whether said first clock buffer and said second clock buffer are equivalent;

in response to a determination that said first clock buffer and said second clock buffer are equivalent, determining whether a majority of said second ones are physically closer to said first clock buffer; and in response to said a determination that a majority of said second ones are physically closer to said first clock buffer, exchanging said first ones with said second ones, wherein said first ones are fed by said second clock buffer and said second ones are fed by said first clock buffer.

9. A data processing system for improving wireability near clock nets in a logic design that includes a plurality of logic blocks, said data processing system comprising:

means for identifying ones of said plurality of logic blocks that are a particular type logic block, each one of said plurality of logic blocks having an actual physical size;

during placement of said plurality of logic blocks and synthesis of said logic design, means for utilizing an apparent physical size for each of said identified ones of said plurality of logic blocks as a physical size for said identified ones, said apparent physical size being larger than said actual physical size; and during routing, means for utilizing said actual physical size for each of said identified ones of said plurality of logic blocks as the physical size for said identified ones;

means for identifying a maximum physical size for each one of said plurality of logic blocks that are a particular type;

means for specifying a perimeter buffer size; and means for specifying said apparent physical size to be equal to said maximum physical size plus said perimeter buffer size.

10. The system according to claim 9, further comprising:

means for providing a library of said ones of said plurality of logic blocks that are said particular type, said library including said ones of said plurality of logic blocks that have different physical sizes; and means for increasing an apparent physical size by selecting a first one of ones of said plurality of logic blocks that is said particular type, said first one having a maximum physical size.

11. The system according to claim 9, further comprising:

means for identifying ones of said plurality of logic blocks that are clock buffers; and means for increasing an apparent physical size of each one of said clock buffers.

12. The system according to claim 9, further comprising:

means for identifying ones of said plurality of logic blocks that are latches; and means for increasing an apparent physical size of each one of said latches.

13. The system according to claim 9, further comprising:

means for identifying a first one of said plurality of logic blocks, said first one of said plurality of logic blocks being said particular type;

means for identifying ones of said plurality of logic blocks that are fed by said first one of said plurality of logic blocks;

means for determining a region defined by a physical location of each one of said identified ones of said plurality of logic blocks that are fed by said first one; and means for placing said first one of said plurality of logic blocks at a physical location in said logic design that is a center of said region.

14. The system according to claim 13, further comprising:

means for determining a rectangle defined by said physical location of each one of said identified ones of said plurality of logic blocks that are fed by said first one of said plurality of logic blocks; and means for placing said first one of said plurality of logic blocks at a physical location in said logic design that is a center of said rectangle.

15. The system according to claim 9, further comprising:
means for identifying ones of said plurality of logic blocks that are latches; and
means for assigning a high net weight to each one of said identified latches.

16. The system according to claim 9, further comprising:
means for identifying a first clock buffer;
means for identifying first ones of said plurality of logic blocks that are fed by said first clock buffer;
means for identifying a second clock buffer;
means for identifying second ones of said plurality of logic blocks that are fed by said second clock buffer;
means for determining whether said first clock buffer and said second clock buffer are equivalent;
in response to a determination that said first clock buffer and said second clock buffer are equivalent means for determining whether a majority of said second ones are physically closer to said first clock buffer; and
in response to a determination that a majority of said second ones are physically closer to said first clock buffer, means for exchanging said first ones with said second ones, wherein said first ones are fed by said second clock buffer and said second ones are fed by said first clock buffer.

17. A computer program product in a data processing system for improving wireability near clock nets in a logic design that includes a plurality of logic blocks, said computer program product comprising the steps of:
instruction means for identifying ones of said plurality of logic blocks that are a particular type logic block, each one of said plurality of logic blocks having an actual physical size;
during placement of said plurality of logic flocks and synthesis of said logic design, instruction moans for utilizing an apparent physical size for each of said identified ones of said plurality of logic blocks as a physical size for said identified ones, said apparent physical size being larger than said actual physical size identified ones; and
during routing, instruction means for utilizing said actual physical size for each of said identified ones of said plurality of logic blocks as the physical size for said identified ones;
instruction means for identifying a maximum physical size for each one of said plurality of logic blocks that are a particular type;
instruction means for specifying a perimeter
instruction means for specifying said apparent physical size to be equal to said maximum physical size-plus said perimeter buffer size.

18. The product according to claim 17, further comprising:
instruction means for providing a library of said ones of said plurality of logic blocks that are said particular type, said library including said ones of said plurality of logic blocks that have different physical sizes; and
instruction means for increasing an apparent physical size by selecting a first one of ones of said plurality of logic blocks that is said particular type, said first one having a maximum physical size.

19. The product according to claim 1, further comprising:
instruction means for identifying ones of said plurality of logic blocks that are clock buffers; and
instruction means for increasing an apparent physical size of each one of said clock buffers.

20. The product according to claim 17, further comprising:
instruction means for identifying ones of said plurality of logic blocks that are latches; and
instruction means for increasing an apparent physical size of each one of said latches.

21. The product according to claim 19, further comprising:
instruction means for identifying a first one of said plurality of logic blocks, said first one of said plurality of logic blocks being said particular type;
instruction means for identifying ones of said plurality of logic blocks that are fed by said first one of said plurality of logic blocks;
instruction means for determining a region defined by a physical location of each one of said identified ones of said plurality of logic blocks that are fed by said first one; and
instruction means for placing said first one of said plurality of logic blocks at a physical location in said logic design that is a center of said region.

22. The product according to claim 21, further comprising:
instruction means for determining a rectangle defined by said physical location of each one of said identified ones of said plurality of logic blocks that are fed by said first one of said plurality of logic blocks; and
instruction means for placing said first one of said plurality of logic blocks at a physical location in said logic design that is a center of said rectangle.

23. The product according to claim 17, further comprising:
instruction means for identifying ones of said plurality of logic blocks that are latches; and
instruction means for assigning a high net weight to each one of said identified latches.

24. The product according to claim 19, further comprising:
instruction means for identifying a first clock buffer;
instruction means for identifying first ones of said plurality of logic blocks that are fed by said first clock buffer;
instruction means for identifying a second clock buffer;
instruction means for identifying second ones of said plurality of logic blocks that are fed by said second clock buffer;
instruction means for determining whether said first clock buffer and said second clock buffer are equivalent;
in response to a determination that said first clock buffer and said second clock buffer are equivalent, instruction means for determining whether a majority of said second ones are physically closer to said first clock buffer; and
in response to a determination that a majority of said second ones are physically closer to said first clock buffer, instruction means for exchanging said first ones with said second ones, wherein said first ones are fed by said second clock buffer and said second ones are fed by said first clock buffer.

* * * * *